US010659736B2

(12) United States Patent
Miyazaki

(10) Patent No.: US 10,659,736 B2
(45) Date of Patent: May 19, 2020

(54) ALIGNMENT APPARATUS, LITHOGRAPHY APPARATUS, AND ARTICLE MANUFACTURING METHOD

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/227,207

(22) Filed: Dec. 20, 2018

(65) Prior Publication Data
US 2019/0199972 A1    Jun. 27, 2019

(30) Foreign Application Priority Data

Dec. 27, 2017 (JP) .................. 2017-252068

(51) Int. Cl.
| | |
|---|---|
| H04N 7/18 | (2006.01) |
| G03F 9/00 | (2006.01) |
| G03F 1/42 | (2012.01) |
| H04N 5/232 | (2006.01) |
| G06K 9/00 | (2006.01) |

(52) U.S. Cl.
CPC .............. H04N 7/183 (2013.01); G03F 1/42 (2013.01); G03F 9/7088 (2013.01); G06K 9/00 (2013.01); H04N 5/232 (2013.01); H04N 5/23212 (2013.01); H04N 5/23229 (2013.01)

(58) Field of Classification Search
CPC .... H04N 7/183; H04N 5/232; H04N 5/23229; H04N 5/23212; G03F 1/42; G03F 9/7088; G06K 9/00
See application file for complete search history.

(56) References Cited

U.S. PATENT DOCUMENTS

| 7,864,308 B2 | 1/2011 | Sato | |
|---|---|---|---|
| 2007/0242317 A1* | 10/2007 | Hashiguchi | ......... G03F 7/70791 358/474 |
| 2008/0088843 A1* | 4/2008 | Shibazaki | ............. G03F 9/7003 356/399 |
| 2013/0038778 A1* | 2/2013 | Ichimiya | ............ H04N 5/23212 348/349 |

FOREIGN PATENT DOCUMENTS

| JP | H11329943 A | 11/1999 |
|---|---|---|
| JP | 2009192271 A | 8/2009 |

\* cited by examiner

*Primary Examiner* — Tracy Y. Li
(74) *Attorney, Agent, or Firm* — Rossi, Kimms & McDowell LLP

(57) ABSTRACT

An alignment apparatus performs alignment of a substrate is provided. The apparatus comprises a stage that moves while holding a substrate, an imaging device that captures an image of a mark on the substrate, and a processor that obtains a position of the mark based on the image of the mark. The imaging device includes an image sensor and a storage device that stores image data obtained by the image sensor. The imaging device performs next image capturing after the image sensor performs accumulation of charge and transfer of image data to the storage device is completed. The apparatus moves the stage for next image capturing concurrently with transfer of the image data to the storage device when capturing an image of the mark using the imaging device at a plurality of positions while moving the stage.

13 Claims, 15 Drawing Sheets

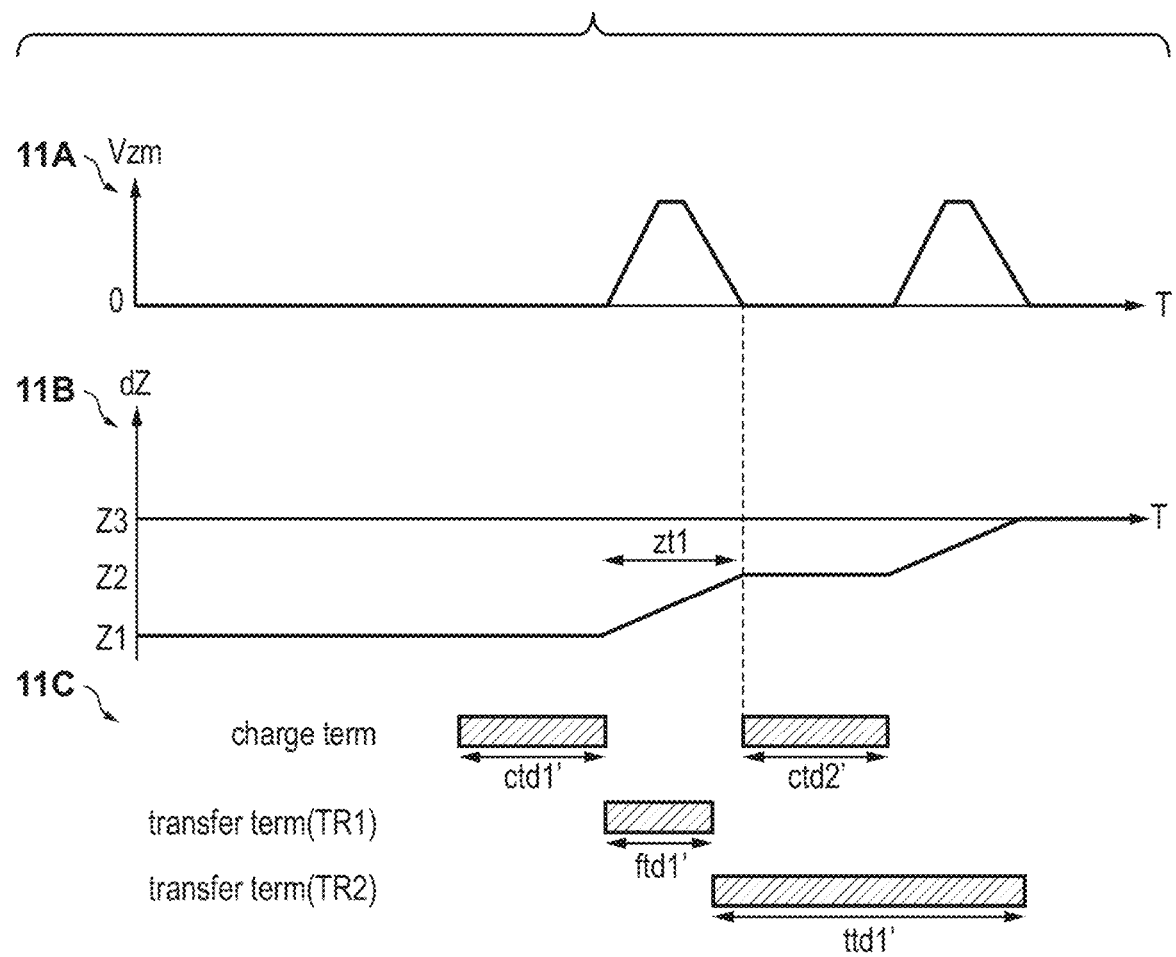

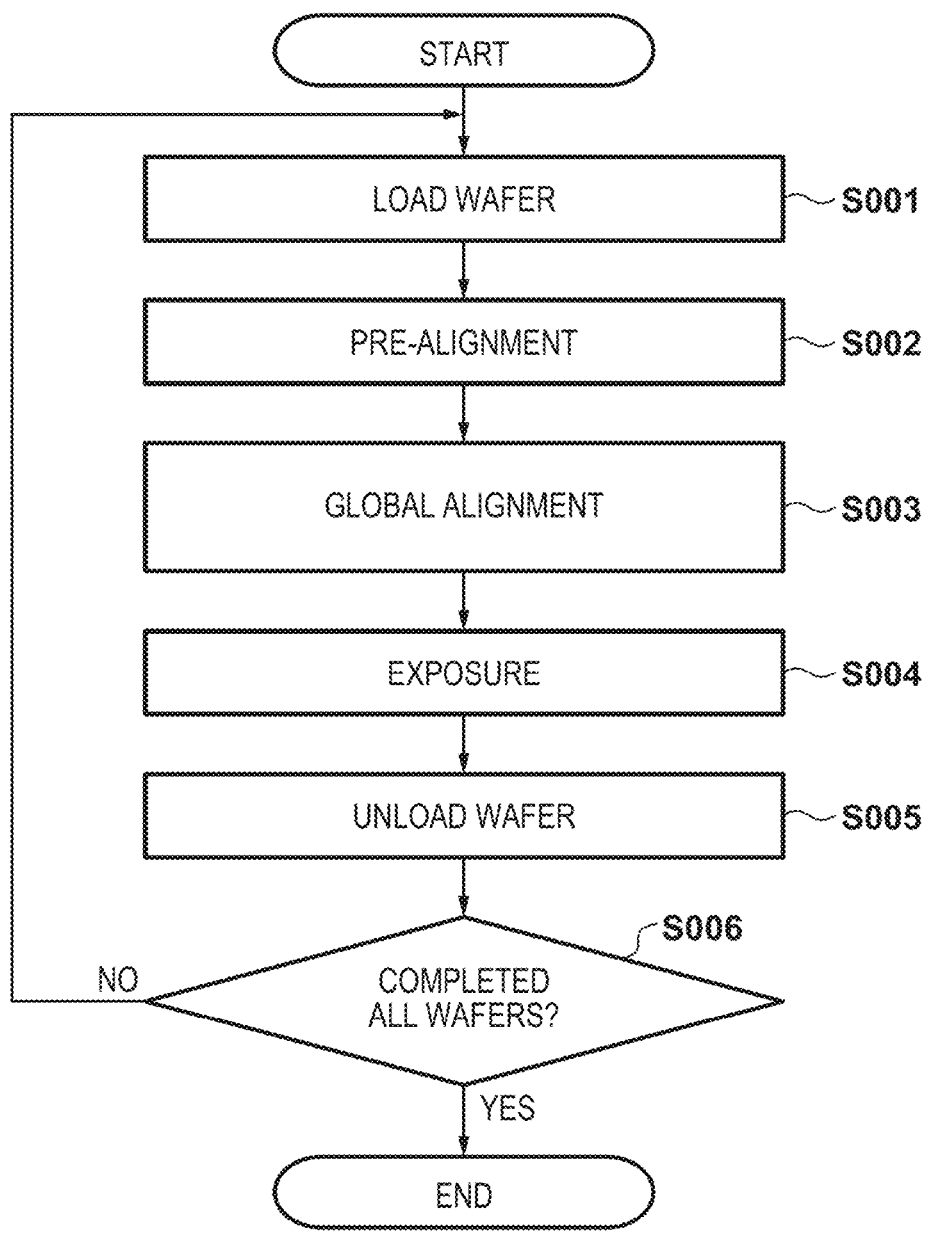

ALIGNMENT APPARATUS, LITHOGRAPHY APPARATUS, AND ARTICLE MANUFACTURING METHOD

BACKGROUND OF THE INVENTION

Field of the Invention

The present invention relates to an alignment apparatus, a lithography apparatus, and an article manufacturing method.

Description of the Related Art

With advances in the miniaturization (integration) of semiconductor devices, exposure apparatuses have also been required to achieve high accuracy and high functionality. Alignment accuracy between originals and substrates, in particular, directly influences the function of exposure apparatuses, and hence has been required to improve. In addition to the requirements for higher alignment accuracy of exposure apparatuses, an increase in throughput (the number of substrates that can be processed per unit time) has been required in consideration of productivity.

In order to accurately align an original with a substrate, it is important to capture images of marks (alignment marks) formed on a measurement target (for example, a substrate) with an imaging device under optimal conditions. For example, a substrate as a measurement target can change in flatness within the substrate surface in accordance with pre-processing steps. Accordingly, in order to capture images of the marks under optimal conditions, focus adjustment needs to be performed so as to set each mark to the best focus position of a sensor. A conventional exposure apparatus performs focus adjustment, for example, in the following manner. First of all, while a substrate is moved step by step in the focus direction (Z direction), a contrast evaluation value is calculated at each position of the substrate from images of marks on a substrate which are obtained by imaging. A position where an optimal evaluation value is obtained is decided as a best focus position (see Japanese Patent Laid-Open No. 2009-192271).

In alignment, after the above focus adjustment is performed, images of a plurality of alignment marks on a substrate are captured, and the positions of the marks in the substrate plane direction (X and Y directions) are calculated from the respective mark images. Each shot position on the substrate is obtained by performing statistical processing of the calculated mark positions. In exposure processing by the exposure apparatus, the position of the substrate or the original is corrected based on each shot position on the substrate which is obtained by alignment.

A method of capturing images of a plurality of alignment marks is performed, for example, in the following manner. First of all, the stage on which the substrate is mounted is moved in the X and Y directions to allow observation of the alignment marks attached at measurement shot positions on the substrate with the sensor. The stage is then caused to rest. While the stage is at rest, the sensor accumulates images of the alignment marks. When the accumulation is completed, the stage is moved to a next measurement shot position. These operations are repeated to capture mark images at all the measurement shots. The mark images accumulated in the sensor are transferred to an alignment processor. The alignment processor calculates the positions of the marks from the transferred mark images. Such image transfer and mark calculation processing are often performed concurrently with the movement of the stage to the next measurement shot. Performing such concurrent processing can improve the throughput (see Japanese Patent Laid-Open No. 11-329943).

In recent years, cameras used to capture images of alignment marks have achieved remarkable improvements in resolution. However, with an increase in the resolution of a sensor, the amount of image data increases, resulting in an increase in the transfer time of images from the camera. This makes it impossible for a conventional exposure apparatus to allow the sensor to start accumulation until the completion of image transfer from the camera. This increases the time required to capture images of the alignment marks.

SUMMARY OF THE INVENTION

The present invention provides an alignment apparatus advantageous in shortening the time required to capture images of alignment marks.

The present invention in its one aspect provides an alignment apparatus that performs alignment of a substrate by detecting a mark provided on the substrate, the apparatus comprising a stage configured to move while holding the substrate, an imaging device configured to capture an image of the mark on the substrate held by the stage, and a processor configured to obtain a position of the mark based on the image of the mark captured by the imaging device, wherein the imaging device includes an image sensor configured to accumulate charge by photoelectric conversion, and a storage device configured to temporarily store image data obtained based on the charge accumulated by the image sensor, the imaging device is configured to perform next image capturing after the image sensor performs accumulation of the charge and transfer of image data obtained by the accumulation to the storage device is completed, and the alignment apparatus moves the stage for next image capturing concurrently with transfer of the image data to the storage device when capturing an image of the mark using the imaging device at a plurality of positions while moving the stage.

Further features of the present invention will become apparent from the following description of exemplary embodiments (with reference to the attached drawings).

BRIEF DESCRIPTION OF THE DRAWINGS

FIG. 11 is a view showing the imaging timings of the stage and the camera in focus measurement according to Example 5 of the first embodiment;

FIG. 13 is a flowchart showing an exposure method according to the third embodiment.

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

One aspect of the present invention relates to an alignment apparatus that performs alignment of a substrate by detecting the marks provided on the substrate. The alignment apparatus according to the present invention can be applied to an alignment apparatus for an original and a substrate in a lithography apparatus such as an exposure apparatus or an imprint apparatus, and can also be applied to other apparatuses such as a process apparatus, an inspection apparatus, and a microscope. The following will exemplify a case in which the alignment apparatus according to the present invention is applied to an exposure apparatus.

First Embodiment

Figure 1:
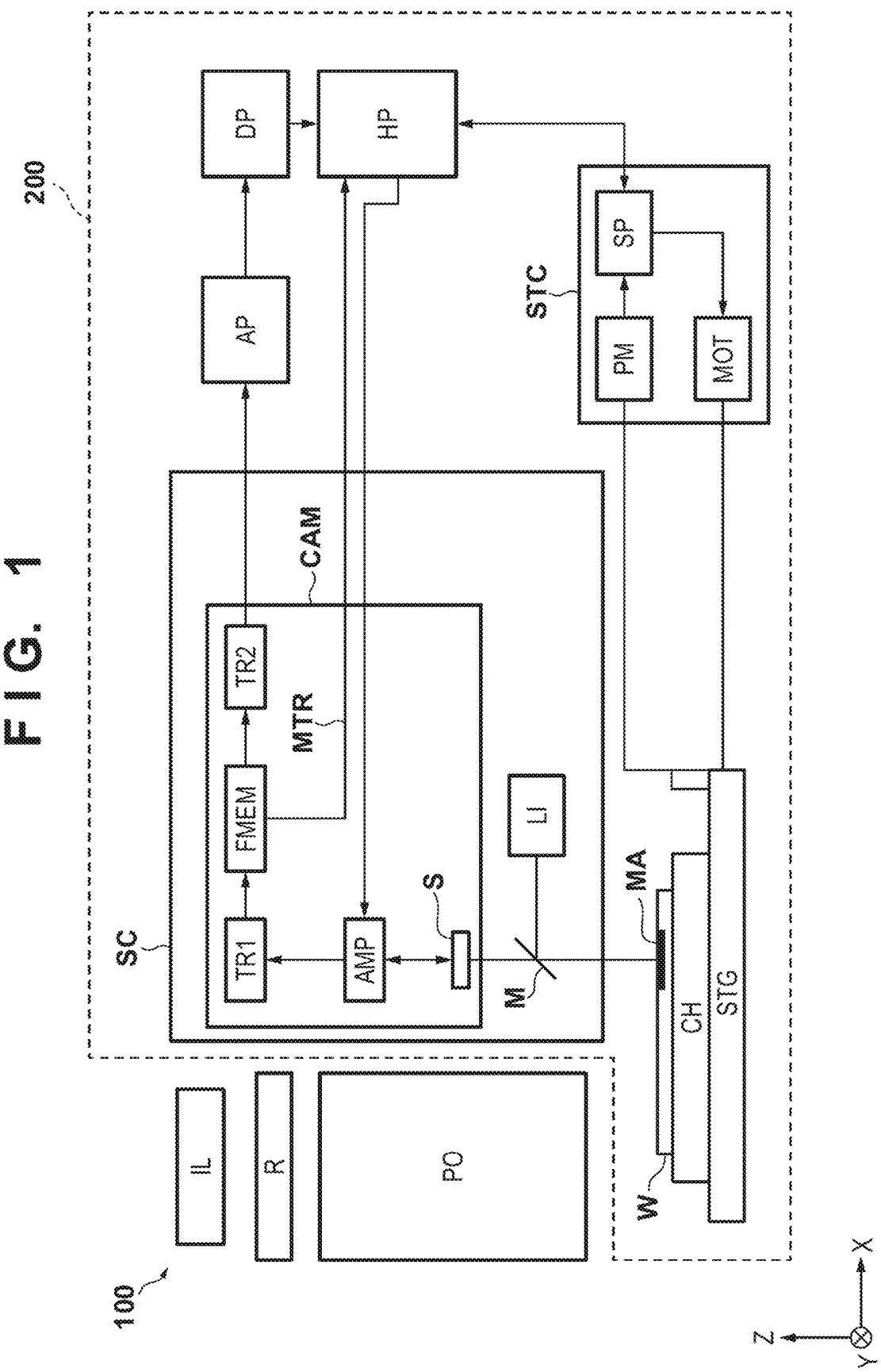
FIG. 1 is a block diagram showing the arrangement of an exposure apparatus according to an embodiment.

FIG. 1 is a view showing the arrangement of an exposure apparatus 100 including an alignment apparatus 200. The exposure apparatus 100 is an apparatus that aligns a reticle R as an original with a wafer W as a substrate and then transfers the pattern of the reticle R onto the wafer W via a projection optical system PO by irradiating the reticle R with exposure light using an illumination system IL. The wafer W is mounted on a stage STG that can move in the X, Y, and Z directions via a chuck CH that holds the wafer. When a host controller HP transmits the coordinates of a target position to a stage processor SP in a stage controller STC, the stage processor SP controls a motor MOT to drive the stage STG to the received coordinates of the target position. An interferometer PM accurately measures the position of the stage STG.

A plurality of alignment marks (to be also simply referred to as "marks" hereinafter) are provided on the wafer W to align the wafer W. For example, as indicated by alignment marks MA shown in FIG. 2A, alignment marks have positional information in the two X and Y directions. Positional information in the X direction is measured from a plurality of marks arrayed in a direction perpendicular to the X direction. Positional information in the Y direction is measured from a plurality of marks arrayed in a direction perpendicular to the Y direction. Assume that the X direction and the Y direction are perpendicular to each other.

The exposure apparatus 100 includes a scope SC for the observation of alignment marks. Light emitted from a light source LI is introduced to a half mirror M via a fiber or dedicated optical system to irradiate the alignment marks MA via a projection optical system or the like (not shown). An image of the alignment mark MA is reflected by the wafer W, passes through the half mirror M, and is projected on a sensor S in a camera CAM as an imaging device. The sensor S includes an image sensor that accumulates charge by photoelectric conversion. For example, a CMOS image sensor is used as such an image sensor.

The camera CAM includes a frame memory FMEM as a storage device that temporarily stores image data obtained based on charge accumulated by the image sensor. The frame memory FMEM has a capacity large enough to store the image data of a plurality of frames. In order to obtain images of alignment marks, the sensor S performs photoelectric conversion. At this time, the host controller HP causes a sensor controller AMP to control the time taken for the accumulation of charge. In addition, the stage processor SP informs the host controller HP of the timing of accumulating charge to give a corresponding command to the sensor controller AMP. The signal obtained by the sensor S by photoelectric conversion is A/D-converted by the sensor controller AMP. A frame memory transfer unit TR1 (first transfer unit) causes the frame memory FMEM to store the resultant data as image data (to be also simply referred to as an image hereinafter). When the image is stored in the frame memory FMEM, the sensor S becomes ready for charge accumulation for the next image capturing.

A conventional camera cannot start the next image capturing (the next charge accumulation by the sensor) until the completion of the transfer of image data generated by imaging to a processor outside the camera. In contrast to this, the camera CAM according to this embodiment temporarily stores image data in the frame memory FMEM before transferring the image data to an alignment processor AP outside the camera. The camera CAM according to the embodiment can start the next image capturing as long as the transfer image data generated by imaging to the frame memory FMEM is completed even if the transfer of the image data to the alignment processor is not completed. This makes it possible to start the next image capturing in a shorter time than conventional cameras.

The host controller HP can control image capturing (charge accumulation). The camera CAM may include a notification unit MTR that notifies the host controller HP that the transfer of image data to the frame memory FMEM is completed and the next image capturing can be performed. The notification unit MTR can be implemented by preparing a dedicated signal line between the camera CAM and the host controller HP. This allows the host controller HP to control the start timing of the next image capturing by the camera CAM based on a notification from the notification unit MTR. Note that an imaging enable timing may be decided based on a sensor accumulation time and the image transfer time of the frame memory transfer unit TR1 which are specified in advance.

The frame memory FMEM can store a plurality of images. Accordingly, even if a previously stored image remains, the sensor S can be made ready for accumulation again by storing the remaining image in another region in the frame memory FMEM. In addition, the frame memory FMEM may be formed from a ring buffer that overwrites the oldest image data with the newest image data when the storage area is full.

A camera transfer unit TR2 (second transfer unit) transfers the image read out from the frame memory FMEM to the alignment processor AP. The frame memory FMEM is mounted on, for example, an electronic circuit board in the camera, and the frame memory transfer unit TR1 can also be formed as a data bus on the electronic circuit board. On the other hand, the camera transfer unit TR2 includes a communication line complying with standards such as CameraLink, Ethernet®, or USB®. The frame memory transfer unit TR1 has a shorter communication distance than the camera transfer unit TR2, and hence can be controlled with highfrequency data transfer clocks. Accordingly, the data transfer rate of the frame memory transfer unit TR1 can be made higher than that of the camera transfer unit TR2. In addition, the frame memory transfer unit TR1 can perform image transfer asynchronously with image transfer by the camera transfer unit TR2. Accordingly, even while the camera transfer unit TR2 transfers an image, the frame memory transfer unit TR1 can transfer the next image accumulated in the sensor S to the frame memory FMEM.

The alignment processor AP is a processor that obtains the position of a mark based on an image of the mark captured by the camera CAM. For example, when the camera CAM captures mark images at a plurality of positions while the stage is moved, the alignment processor AP can evaluate the alignment state of the stage at each position. The alignment processor AP calculates an evaluation value with respect to each alignment mark based on an input image. In this case, an evaluation value includes, for example, a contrast value, a line width, and a light amount at an alignment mark portion in focus measurement in the Z direction. In alignment measurement in the X and Y directions, an evaluation value includes a detected mark position. An image is obtained by capturing an image of each alignment mark at a measurement shot set on a wafer.

Figure 3A:
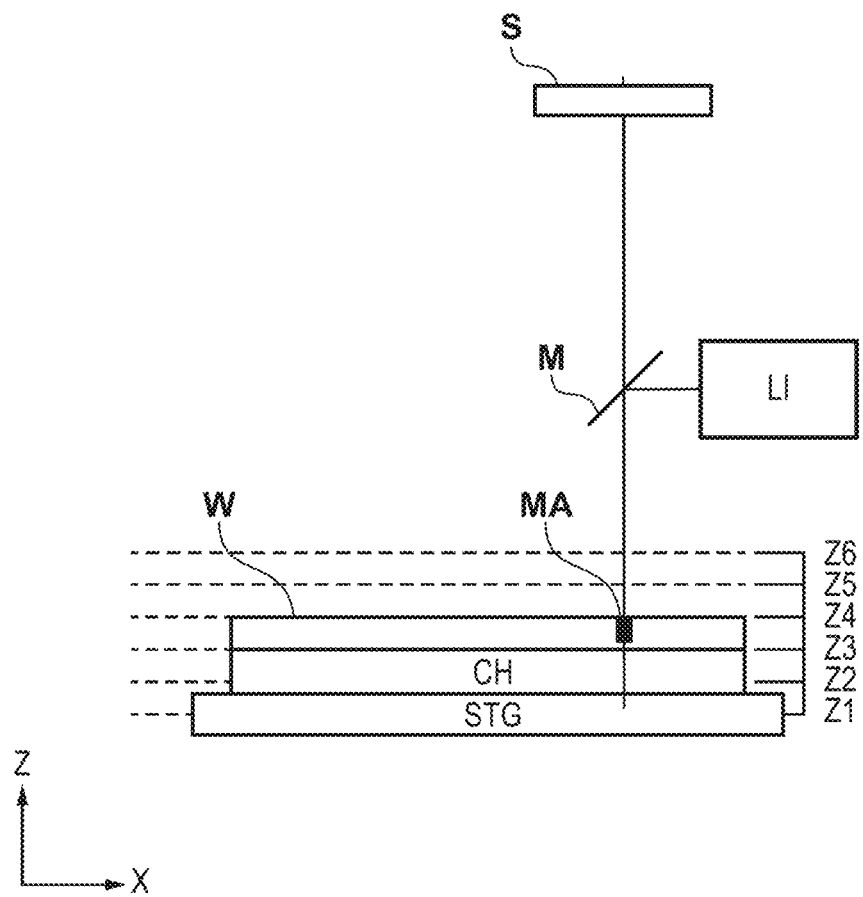
FIGS. 3A and 3B are views for explaining a method of obtaining a best focus.
Figure 3B:
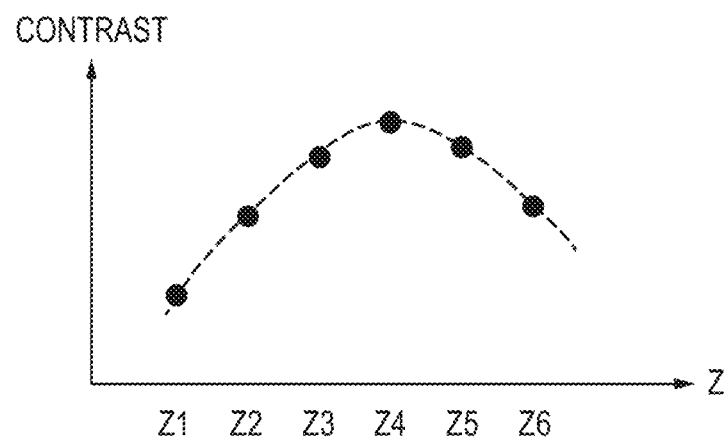

FIGS. 3A and 3B are views for explaining a method of measuring a best focus at the alignment mark position of a given measurement shot. As shown in FIG. 3A, this measurement is performed by capturing images of marks at step positions Z1 to Z6 while moving the stage STG step by step so as to change stepwise the distance between the sensor S and the stage STG, and then evaluating the focus states of the mark images at the respective step positions.

Figure 2A:
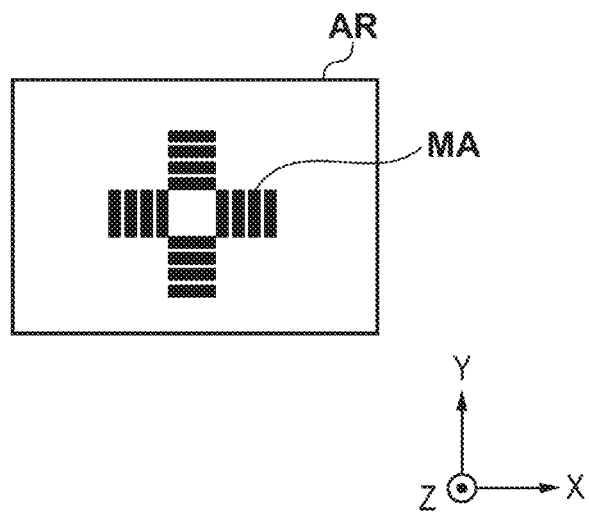
FIGS. 2A and 2B are views showing examples of alignment marks.
Figure 2B:
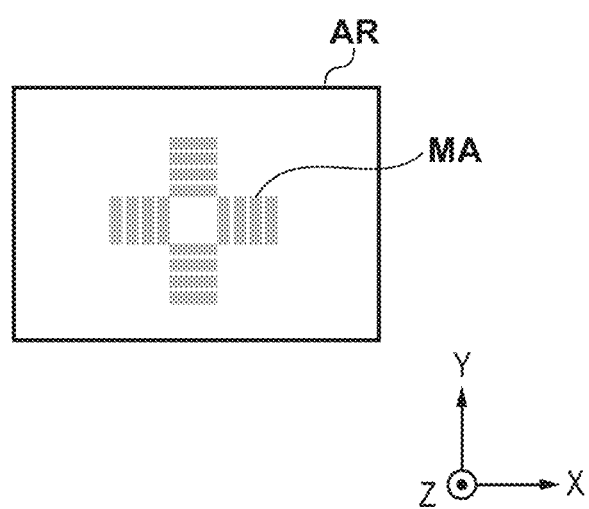

First of all, while the alignment mark MA is at an XY position where the alignment mark MA can be observed with the sensor S, the surface of the wafer W is aligned with the Z position Z1. When the surface of the wafer W is aligned with the Z position Z1, the light source LI illuminates the alignment mark MA via the half mirror M. The sensor S then accumulates an image of the alignment mark MA. Upon completion of the accumulation, the Z position of the wafer surface is moved to Z2. The sensor S then accumulates an image of the alignment mark MA at the Z position Z2. This processing is repeated from the Z position Z1 to the Z position Z6 to obtain images of the alignment mark MA at all the designated Z positions. The obtained images are transferred to the alignment processor AP, which then calculates the contrast of each image. An image captured near a best focus is a clear mark image as shown in FIG. 2A, and hence has high contrast. On the other hand, an image captured at a defocused Z position is an unclear mark image as shown in FIG. 2B, and hence has low contrast. Accordingly, as shown in FIG. 3B, when the abscissa represents Z position and the ordinate represents contrast, plotting the contrast can draw a curve with a best focus position being a peak. The best focus position can be calculated from this curve by using a technique such as centroid computation. Referring to FIG. 3B, the best focus is located near the Z position Z4. In this embodiment, information representing the contrast at each Z position calculated by the alignment processor AP is transferred to a detector DP, which then calculates the best focus position. Note that the alignment processor AP or the host controller HP may include the detector DP. Information representing the best focus position calculated by the detector DP is transferred to the host controller HP. The host controller HP performs alignment measurement by controlling the Z position at each measurement shot based on the information representing this best focus position.

Example 1

Figure 4:
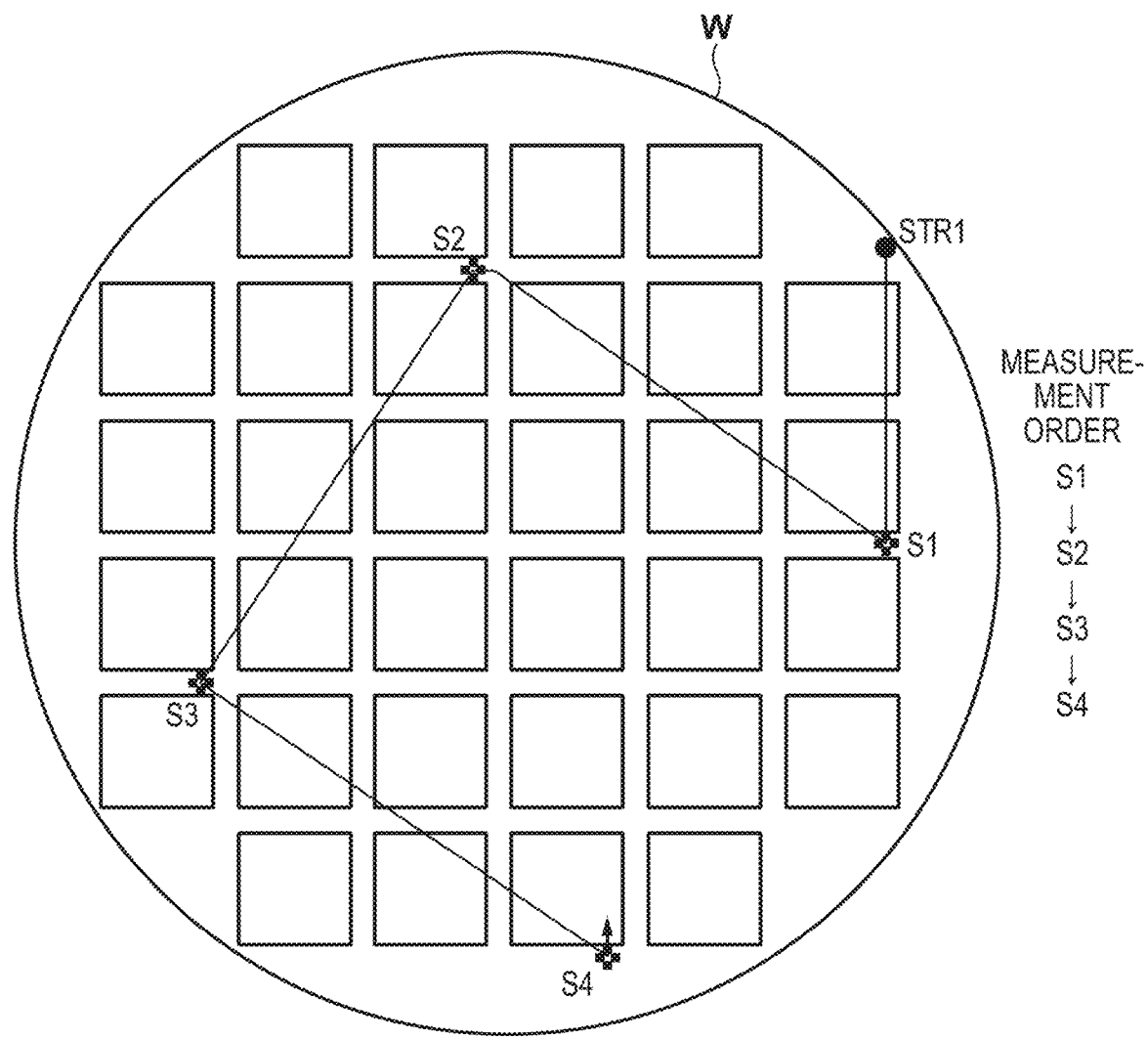
FIG. 4 is a view showing an example of measurement shots on a wafer.
Figure 5:
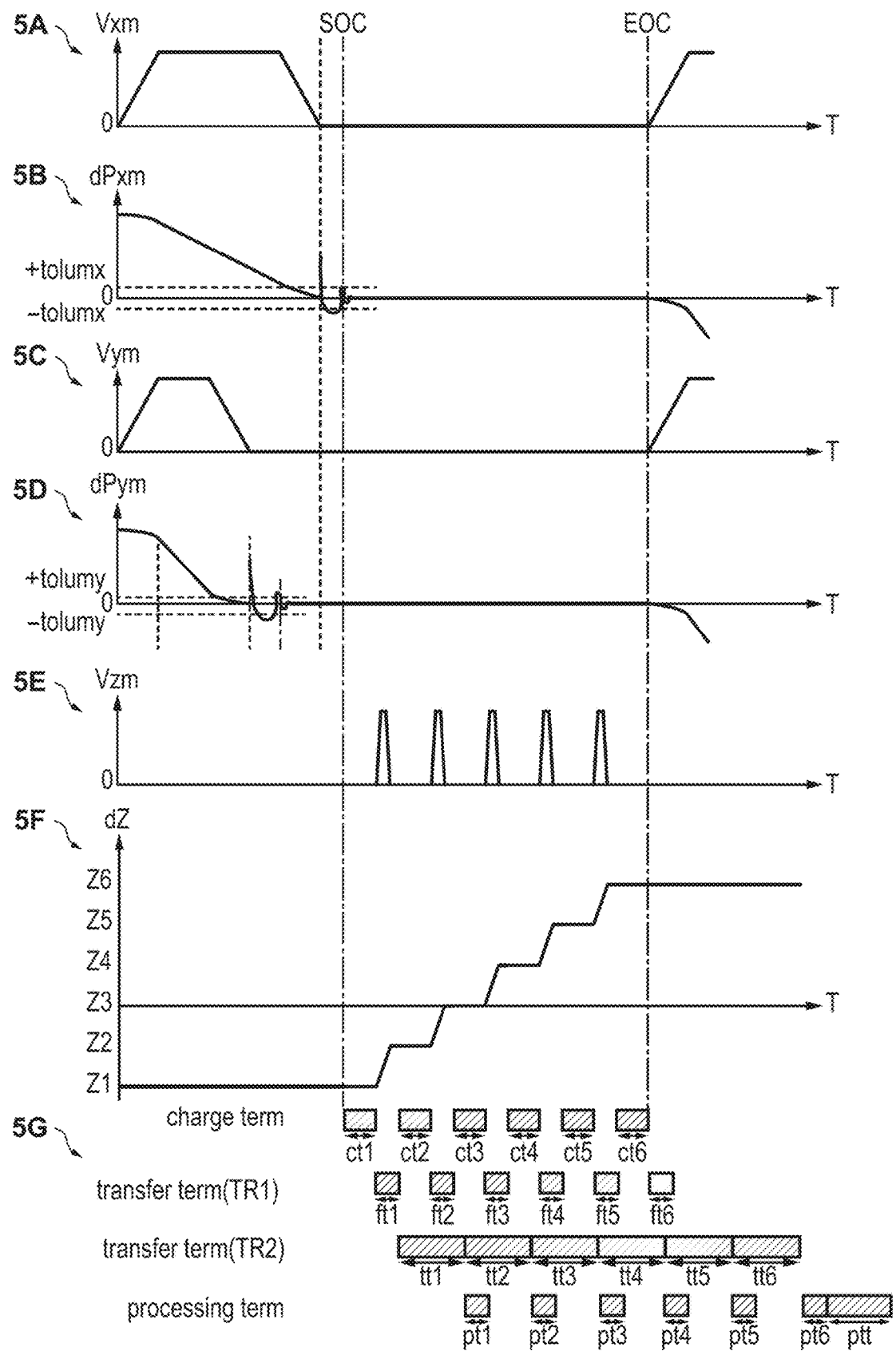
FIG. 5 is a view showing the imaging timings of a stage and a camera in focus measurement according to Example 1 of the first embodiment.

A stage driving pattern and the imaging timing of the camera at the time of capturing an image of an alignment mark in focus measurement will be described in detail below with reference to FIGS. 4 and 5. In this embodiment, measurement shot regions S1 to S4 are set at predetermined different positions on a wafer W, and alignment marks are arranged in the respective measurement shot regions. The example in FIG. 4 shows how a stage STG is driven, from a state in which a predetermined initial position STR1 on the wafer W is located at the imaging position of a camera CAM, so as to be sequentially located in the measurement shot regions S1, S2, S3, and S4. The following will describe a series of processing in which the imaging position is moved from S1 to S2 of the measurement shot regions S1 to S4 to perform focus measurement in S2, and is moved from S2 to S3 upon completion of the focus measurement. A graph 5A in FIG. 5 indicates the moving velocity pattern of the X stage, with the ordinate representing a velocity Vxm and the abscissa representing a time T. A graph 5B indicates residuals relative to the target position of the X stage in this case, with the ordinate representing a residual dPxm and the abscissa representing the time T. A graph 5C indicates the moving velocity pattern of the Y stage, with the ordinate representing a velocity Vym and the abscissa representing the time T. A graph 5D indicates residuals relative to the target position of the Y stage in this case, with the ordinate representing a residual dPym and the abscissa representing the time T. A graph 5E indicates the moving velocity pattern of the Z stage, with the ordinate representing a velocity Vzm and the abscissa representing the time T. A graph 5F indicates the position of the Z stage in this case, with the ordinate representing a position dZ and the abscissa representing the time T. Lastly, a graph 5G indicates the imaging timing of the camera and the measurement timings of an alignment processor AP and a detector DP. More specifically, the graph 5G indicates the following:

the accumulation period (charge term) of the sensor S;
a frame memory transfer period (transfer term (TR1)) from A/D conversion of an image from the sensor S in a sensor controller AMP until the storage of the image in a frame memory FMEM via a frame memory transfer unit TR1
an image transfer period (transfer term (TR2)) until the image is transferred from the frame memory FMEM to the alignment processor AP via a camera transfer unit TR2; and
a processing period (processing term) including a period in which the alignment processor AP calculates contrast from an image and a period in which the detector DP calculates a best focus position from contrast at each Z position.

When the stage is moved from S1 to S2, the stage is driven in the X and Y directions until it reaches a target position. When the stage is stopped at the target position, residuals are caused by the impact of the stoppage of the stage. When the residuals in the X and Y directions respectively converge to the ranges of ±tolumx and ±tolumy, an imaging ready state is set. Assume that SOC represents the imaging start timing. Assume that the Z stage is driven in advance to the first target position Z1. Note that the Z stage may be driven to the first target position Z1 concurrently with driving of the XY stage.

When the imaging ready state is set, an image of the mark at the target position Z1 is accumulated in the sensor in an accumulation period ct1. In the accumulation period ct1, an interferometer PM measures the stage Z position. When the accumulation period ct1 is over, the Z stage is driven to a next target position Z2 concurrently with the transfer of the image of the frame memory FMEM.

When image transfer to the frame memory FMEM is completed, the sensor S is ready for accumulation. Accordingly, when the Z stage reaches the target position Z2, the sensor S accumulates an image of the mark at the target position Z2 in an accumulation period ct2. In this case, Z stage driving (stepped movement) after the completion of the accumulation period is performed in the transfer period of an image to the frame memory FMEM. This stepped movement, in particular, is preferably performed in the same period as the transfer period of the image to the frame memory FMEM. This makes it possible to start next accumulation at the same time as the completion of transfer to the frame memory FMEM, thus allowing efficient imaging processing. The interferometer PM measures the position of the Z stage in the accumulation period ct2 in the same manner as described above.

When the accumulation period ct2 is completed, the Z stage is driven to a next target position Z3 concurrently with the transfer of an image to the frame memory FMEM in a transfer period ft2. Likewise, the sensor accumulates charge at the target positions Z3 Z4, Z5, and Z6 in accumulation periods ct3, ct4, ct5, and ct6, and transfers images to the frame memory FMEM in the transfer periods ft3, ft4, ft5, and ft6. As described above, the interferometer PM measures the position of the Z stage in each of the accumulation periods ct1 to ct6. At an imaging completion timing EOC when the sensor accumulation period ct6 at the target position Z6 is completed, the XY stage is driven toward S3 as a next target position. The images stored in the frame memory FMEM are sequentially transferred to the alignment processor AP in camera transfer periods tt1 to tt6. The frame memory FMEM can store a plurality of images, and hence can repeatedly execute a series of imaging processing at shorter intervals than those of camera transfer processing.

In calculation periods pt1 to pt6, the alignment processor AP calculates contrast from each transferred image. Subsequently, in a calculation period ptt, the detector DP calculates a best focus position from the contrast calculated in each of the periods pt1 to pt6 and the Z position information of the stage measured by the interferometer PM in each of the accumulation periods ct1 to ct6. Upon performing such processing at all measurement shots, the host controller HP performs alignment measurement by controlling the Z position at each measurement shot based on a best focus position at each measurement shot. When calculating a best focus position, the detector DP uses the Z position information of the stage measured by the interferometer PM. However, when performing this processing in a simplified manner, the detector DP may calculate a best focus position from a target Z position. However, the exposure apparatus needs to accurately calculate a focus position, and hence preferably uses the Z position information of the stage measured by the interferometer PM.

Example 1 of the first embodiment has been described above. Conventionally, unless the transfer of image data generated by imaging by the camera to the processor outside the camera is completed, the camera cannot start the next image capturing (charge accumulation by the sensor). In contrast to this, as described above, the camera CAM according to this embodiment temporarily stores image data in the frame memory FMEM before the transfer of the image data to the alignment processor AP. The camera CAM according to this embodiment can start the next image capturing when the transfer of image data generated by imaging to the frame memory FMEM is completed even if the transfer of the image data to the alignment processor is not completed. Accordingly, in Example 1, when an image of a mark is captured at a plurality of positions while the stage is moved, the stage is moved for the next image capturing concurrently with the transfer of image data to the frame memory FMEM. This makes it possible to perform image capturing a plurality of times at shorter intervals than a transfer period for the frame memory FMEM. As a result, in the example shown in FIG. 5, it is possible to shorten the time from the imaging start timing SOC to the imaging completion timing EOC.

Example 2

Figure 6:
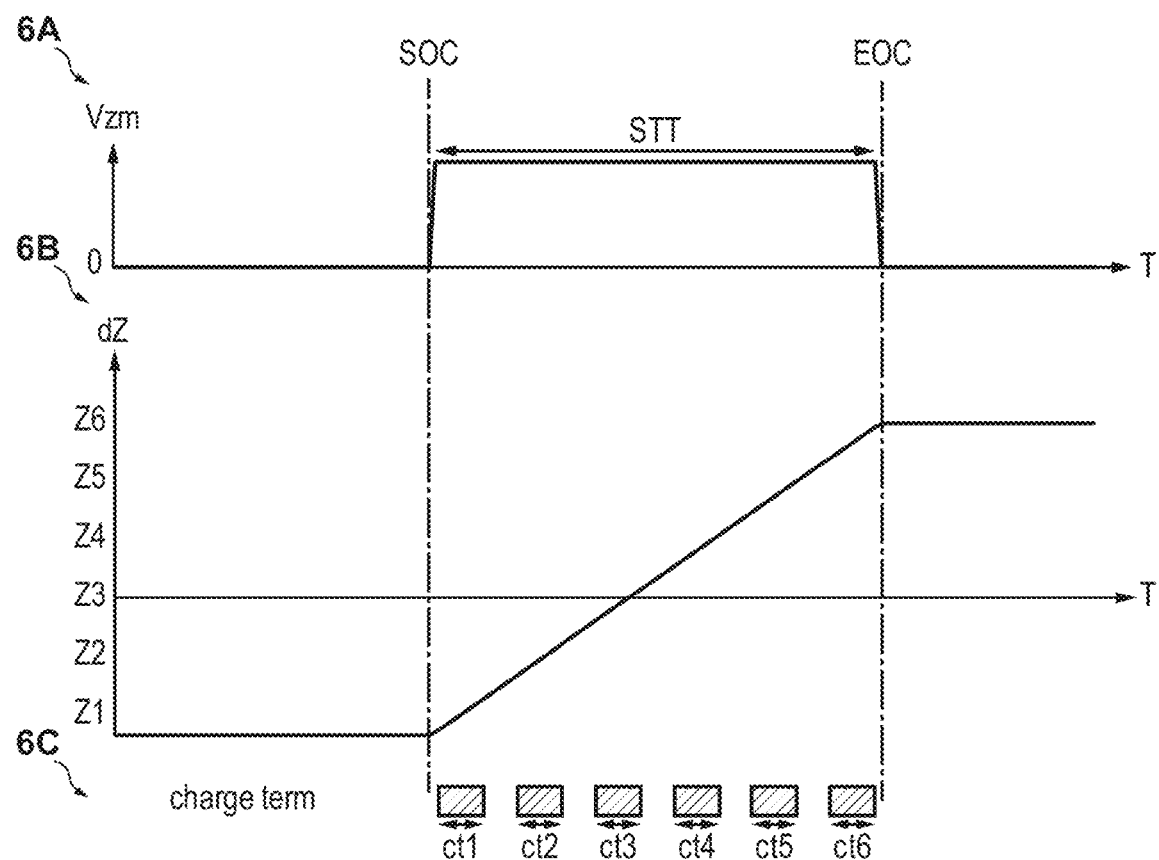
FIG. 6 is a view showing the imaging timings of a stage and a camera in focus measurement according to Example 2 of the first embodiment.

Example 2 of the first embodiment will be described next with reference to FIG. 6. Example 2 is featured such that the Z stage is driven by scanning at the time of focus measurement. The Z stage according to Example 1 is driven by stepped movement. This makes it possible to perform accurate measurement at each position. In contrast to this, according to Example 2, although the accuracy of the Z stage is inferior to that of Example 1, measurement can be performed at high speed. Example 2 is the same as Example 1 except for the method of driving the Z stage. A graph 6A indicates the moving velocity pattern of the Z stage, with the ordinate representing a velocity Vzm and the abscissa representing a time T. A graph 6B indicates the position of the Z stage in this case, with the ordinate representing a position dZ and the abscissa representing the time T. A graph 6C indicates a sensor accumulation period (charge term) included in the imaging timing of the camera.

When an imaging start timing SOC comes, Z-drive of the stage starts. When the stage enters a constant velocity period STT, sensor accumulation is performed in sensor accumulation periods ct1 to ct6. An interferometer PM measures the Z position of the stage in each of the accumulation periods ct1 to ct6. When the stage reaches a final target position Z6, the scanning drive is stopped. As in Example 1, when images are transferred to an alignment processor AP, which then calculates contrast from the image obtained in each of the accumulation periods ct1 to ct6, a detector DP calculates a best focus position. Because scanning drive is performed, the Z position of the stage changes during an accumulation period. When calculating a best focus position, the detector DP uses the average position of a plurality of Z positions of the stage obtained in an accumulation period. That is, the detector DP calculates a best focus position based on contrast and the average position of the Z positions of the stage in each period.

Example 2 of the first embodiment has been described above. Example 2 is configured to perform scanning drive, and hence need not perform stage drive control after accumulation. This shortens the imaging processing time (the time from the imaging start timing SOC to an imaging completion timing EOC) as compared with Example 1.

Example 3

Figure 7:
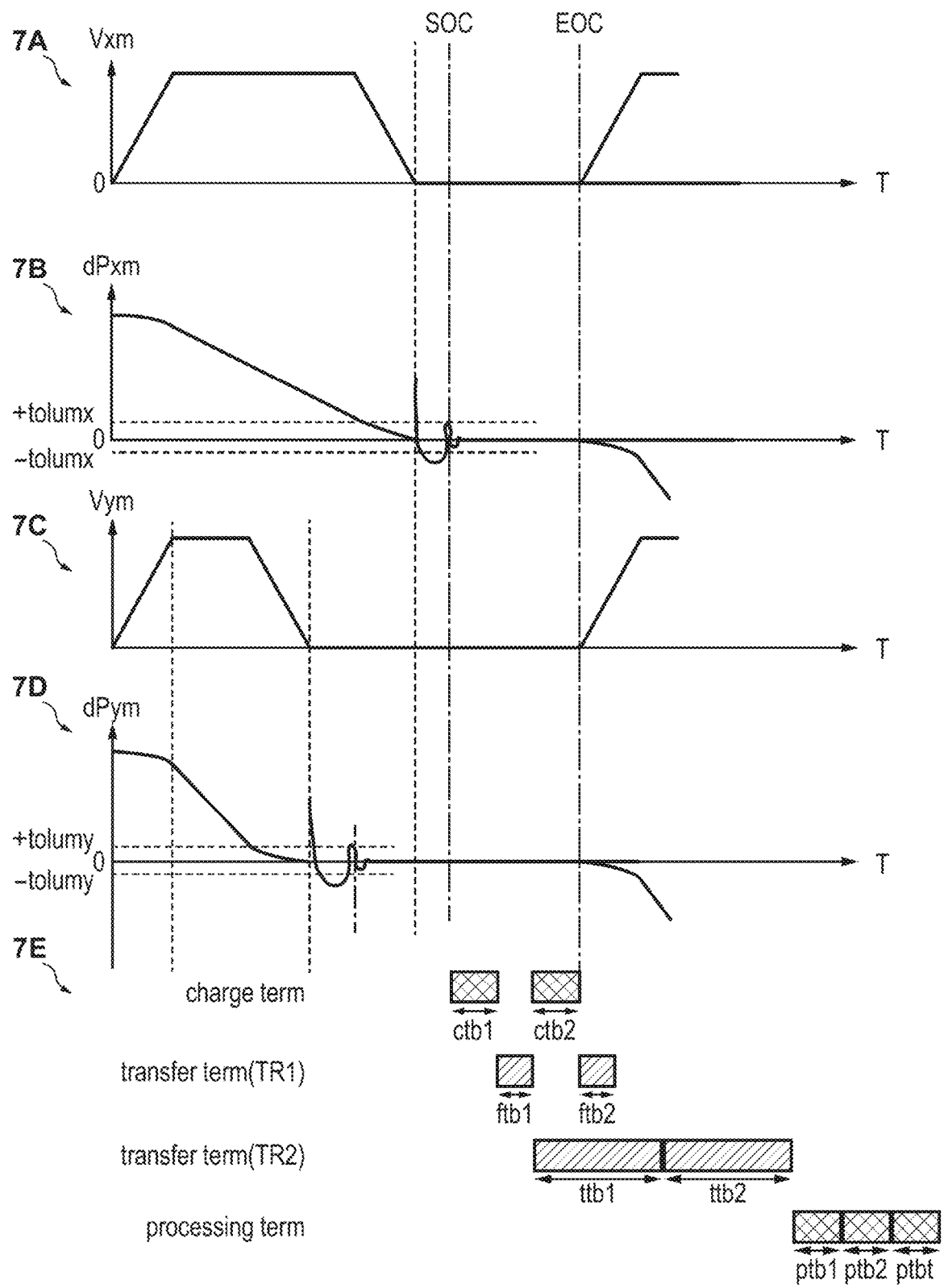
FIG. 7 is a view showing the imaging timings of a stage and a camera in alignment measurement according to Example 3 of the first embodiment.

Examples 1 and 2 have described the processing of obtaining a best focus position. Example 3 will describe a case in which alignment measurement is performed by detecting a plurality of marks provided at different positions on a substrate. In Example 3, an image of the first mark of the above plurality of marks is captured first, and the stage is started to move to capture an image of the second mark of the above plurality of marks during a transfer period in which the image data of the first mark obtained by the image capturing is transferred to the frame memory. A specific example will be described below with reference to FIGS. 4 and 7. The following will describe a series of processing from moving the imaging position from S1 to S2 of measurement shot regions S1 to S4 set on a wafer W in FIG. 4 to perform alignment measurement at S2 to moving the imaging position from S2 to S3.

Alignment measurement can use a method of improving the measurement accuracy of alignment mark positions by capturing an image of alignment mark a plurality of times at the same position and averaging a plurality of calculated alignment mark positions. The following will describe a case in which an image of each alignment mark is captured two times consecutively.

A graph 7A indicates the moving velocity pattern of the X stage, with the ordinate representing a velocity Vxm and the abscissa representing a time T. A graph 7B indicates residuals relative to the target position of the X stage in this case, with the ordinate representing a residual dPxm and the abscissa representing the time T. A graph 7C indicates the moving velocity pattern of the Y stage, with the ordinate representing a velocity Vym and the abscissa representing the time T. A graph 7D indicates residuals relative to the target position of the Y stage in this case, with the ordinate representing a residual dPym and the abscissa representing the time T. A graph 7E indicates the imaging timing of the camera and the measurement timings of an alignment processor AP and a detector DP. More specifically, the graph 7E indicates the following:

- the accumulation period (charge term) of the sensor 5;
- a frame memory transfer period (transfer term (TR1)) from A/D conversion of an image from the sensor S in a sensor controller AMP until the storage of the image in a frame memory FMEM via a frame memory transfer unit TR1;
- a camera transfer period (transfer term (TR2)) until the image is transferred from the frame mentor), FMEM to the alignment processor. AP via a camera transfer unit TR2; and
- a processing period (processing term) in which the alignment processor AP calculates an alignment mark position from an image.

When the stage is moved from S1 to S2, the stage is driven in the X and Y directions until it reaches a target position. When the stage is stopped at the target position, residuals are caused by the impact of the stoppage of the stage. When the residuals in the X and Y directions respectively converge to the ranges of ±tolumx and ±tolumy, an imaging ready state is set. Assume that SOC represents the imaging start timing. Assume that the Z stage is driven in advance to the best focus position obtained in the above-described focus measurement. When the imaging ready state is set, an alignment mark image is accumulated in the sensor in an accumulation period ctb1. In the accumulation period ctb1, an interferometer PM measures the XY position of the stage. When the accumulation period ctb1 is over, an image is transferred to the frame memory FMEM in a transfer period ftb1. When the image transfer to the frame memory FMEM is completed, a sensor S is ready for accumulation, and hence accumulates a second alignment mark image in an accumulation period ctb2. The interferometer PM measures the XY position of the stage in the accumulation period ctb2. At the timing EOC when the accumulation period ctb2 is completed, the XY stage is driven to move toward S3 as a next target position. Concurrently with this operation, the image captured in the accumulation period ctb2 is transferred to the frame memory FMEM in a transfer period ftb2. The images stored in the frame memory FMEM are sequentially transferred to the alignment processor in camera transfer periods ttb1 and ttb2. The frame memory FMEM can store a plurality of images, and hence can perform sensor accumulation without waiting for the completion of camera transfer. That is, it is possible to repeatedly execute sensor accumulation processing at shorter intervals than those of camera transfer processing. The alignment processor calculates alignment mark positions in the calculation periods ptb1 and ptb2 from the images transferred to the alignment processor. Subsequently, in a calculation period ptb1, the alignment processor averages the alignment mark positions calculated in the calculation periods ptb1 and ptb2, and corrects the alignment mark position based on stage XY position information obtained in each accumulation period, thereby calculating a final alignment mark position.

Upon performing such processing at all measurement shots, a host controller HP performs global alignment measurement by using the alignment mark position at each measurement shot. In global alignment, the host controller HP calculates the position of each shot on a wafer W. The pattern of a reticle R is then exposed on the wafer W based on each shot position.

With the above processing, an image of the first mark of a plurality of marks is captured a plurality of times. Subsequently, during a transfer period in which the image data of the first mark obtained by the final image capturing of the plurality of times of image capturing is transferred to the frame memory, the stage is started to move to capture an image of the second mark of the above plurality of marks.

Example 3 of the first embodiment has been described above. Example 3 is configured to use a camera CAM including the frame memory FMEM and repeatedly execute a series of imaging processing including sensor accumulation and stage XY position measurement during sensor accumulation at shorter time intervals than those of camera transfer processing. This can shorten the processing time to capture an alignment mark a plurality of times at each measurement shot.

Example 4

Figure 8:
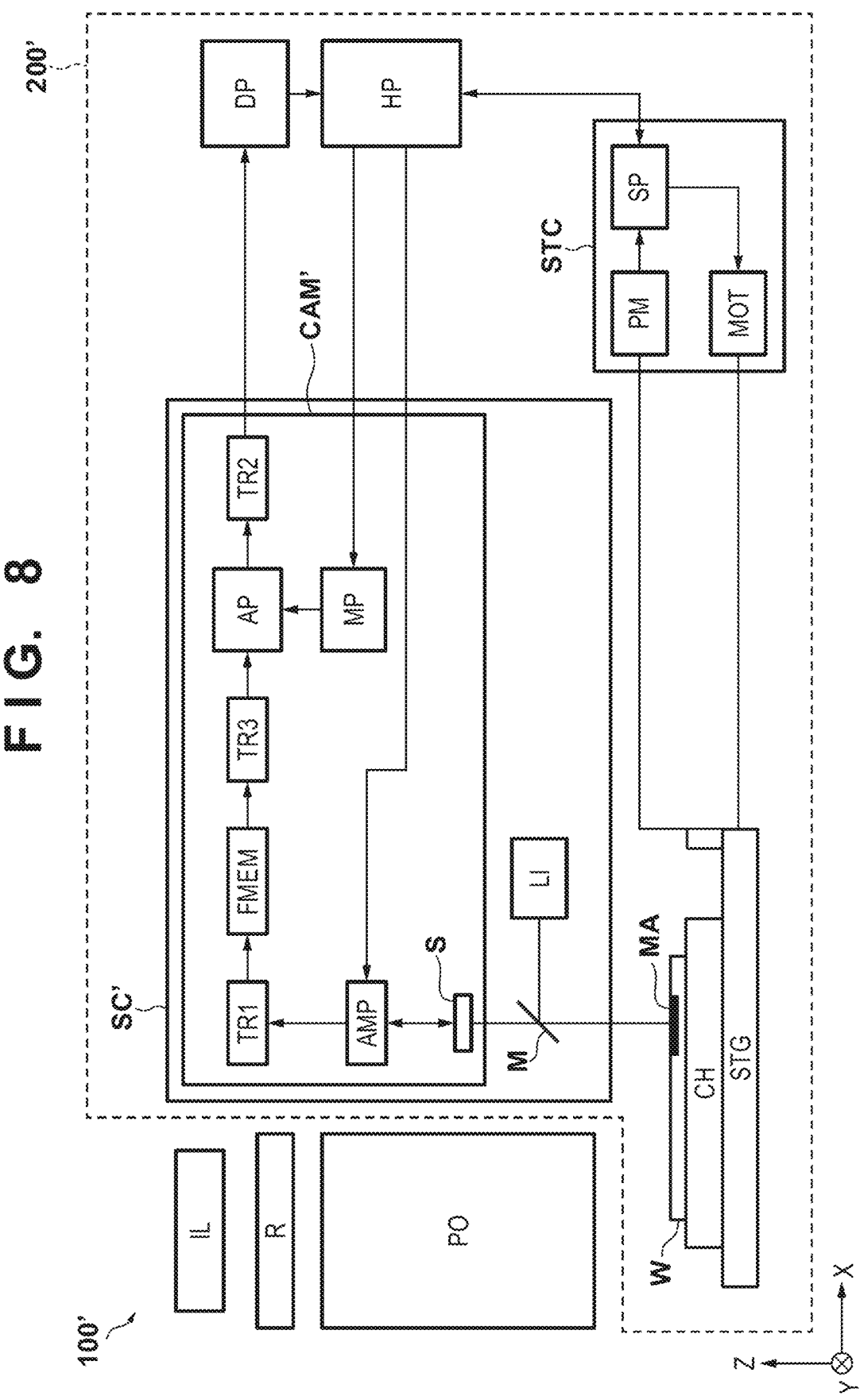
FIG. 8 is a block diagram showing the arrangement of an exposure apparatus according to Example 4 of the first embodiment.
Figure 9:
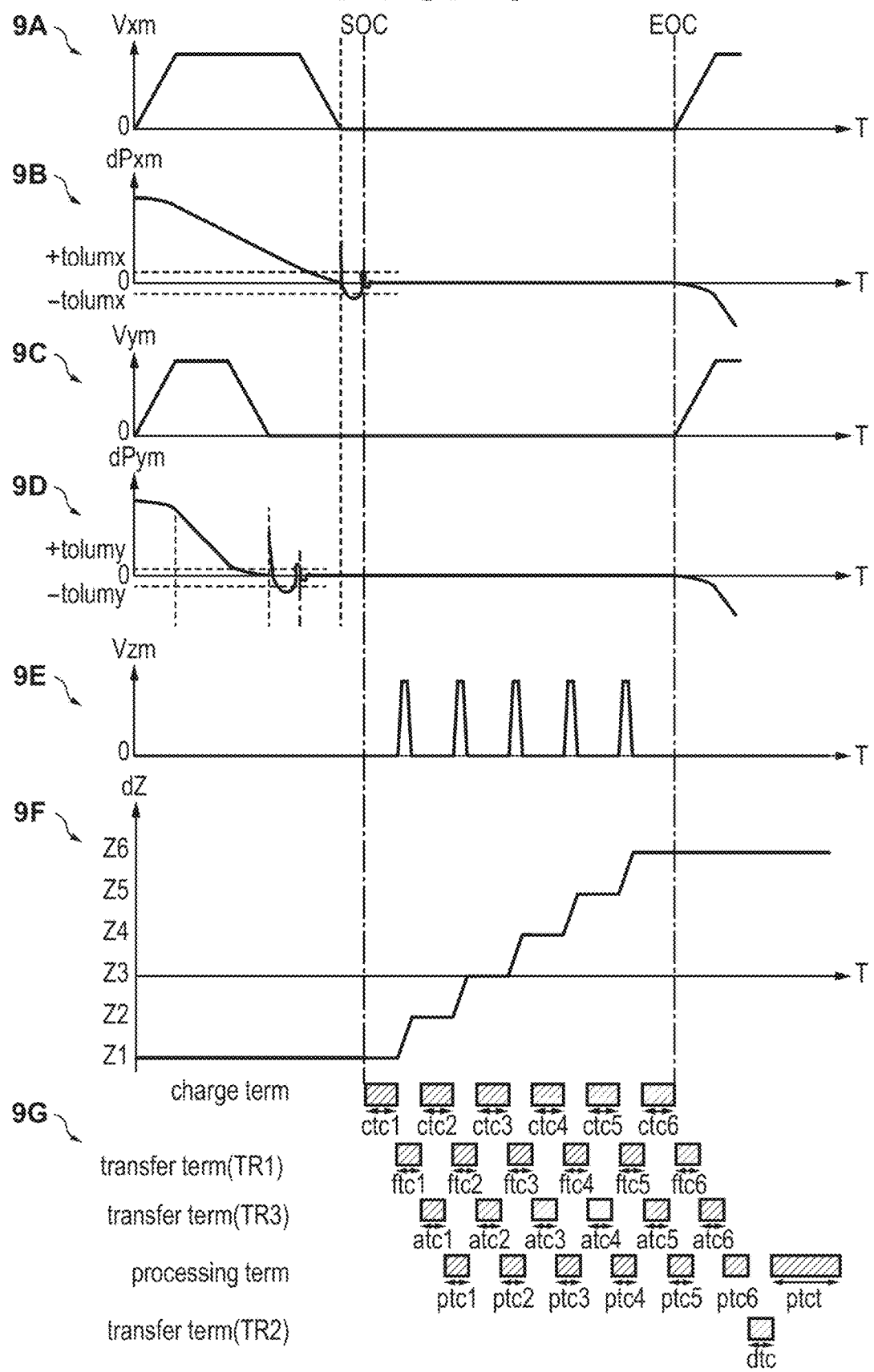
FIG. 9 is a view showing the imaging timings of a stage and a camera in focus measurement according to Example 4 of the first embodiment.

Example 4 of the first embodiment will be described next with reference to FIGS. 8 and 9. An exposure apparatus 100' including an alignment apparatus 200' according to this embodiment includes, in a camera CAM' of a scope SC', an alignment processor AP and a camera transfer unit TR2 that transfers an evaluation value from the alignment processor AP to a detector DP. The exposure apparatus 100' also includes an image transfer unit TR3 that transfers an image from a frame memory FMEM to the alignment processor AP.

Like a frame memory transfer unit TR1, the image transfer unit TR3 can be a data bus formed on an electronic circuit board inside the camera. This configuration can shorten the image transfer time from the frame memory FMEM to the alignment processor AP. In addition, the camera transfer unit TR2 transfers an evaluation value, and hence can shorten the transfer time relative to that required for images. The camera CAM' includes a parameter holding unit MP that stores parameters required for the calculation of evaluation values from images. Before image capturing, a host controller HP sends parameters to the parameter holding unit MP. Parameters include, for example, a window of a measurement region, the type of contrast calculation algorithm in the case of focus measurement, and parameters associated with contrast measurement. In the case of alignment measurement, such parameters include a window of an alignment measurement region and a template for calculating a position by using template matching.

The following is a detailed description of a stage driving pattern and the imaging timing of the camera when the alignment apparatus 200' according to Example 3 captures alignment mark images in focus measurement. The following will describe a series of processing from focus adjustment at S2 upon stepped driving of the stage from S1 to S2 of measurement shots S1 to S4 set on the wafer W in FIG. 4 to stepped driving of the stage from S2 to S3 after the end of the focus measurement. A graph 9A indicates the moving velocity pattern of the X stage, with the ordinate representing a velocity Vxm and the abscissa representing a time T. A graph 9B indicates residuals relative to the target position of the X stage in this case, with the ordinate representing a residual dPxm and the abscissa representing the time T. A graph 9C indicates the moving velocity pattern of the Y stage, with the ordinate representing a velocity Vym and the abscissa representing the time T. A graph 9D indicates residuals relative to the target position of the Y stage in this case, with the ordinate representing a residual dPym and the abscissa representing the time T. A graph 9E indicates the moving velocity pattern of the Z stage, with the ordinate representing a velocity Vzm and the abscissa representing the time T. A graph 9F indicates the position of the Z stage in this case, with the ordinate representing a position dZ and the abscissa representing the time T. Lastly, a graph 9G indicates the imaging timing of the camera and the measurement timings of the alignment processor AP and the detector DP. More specifically, the graph 9G indicates the following:
- the accumulation period (charge term) of a sensor S;
- a frame memory transfer period (transfer term (TR1)) from A/D conversion of an image from the sensor S in a sensor controller AMP until the storage of the image in the frame memory FMEM via a frame memory transfer unit TR1;
- an image transfer period (transfer term (TR3)) until the image is transferred from the frame memory FMEM to the alignment processor AP via the image transfer unit TR3;
- a camera transfer period (transfer term (TR2)) until contrast data as an evaluation value is transferred to the detector DP via the camera transfer unit TR2; and
- a processing period (processing term) including a period in which the alignment processor AP calculates contrast from an image and a period in which the detector DP calculates a best focus position from contrast at each Z position.

When the stage is moved from S1 to S2, the stage is driven in the X and Y directions until it reaches a target position. When the stage is stopped at the target position, residuals are caused by the impact of the stoppage of the stage. When the residuals in the X and Y directions respectively converge to the ranges of ±tolumx and ±tolumy, an imaging ready state is set. Assume that SOC represents the imaging start timing. Assume that the Z stage is driven in advance to the first target position Z1. Note that the Z stage may be driven to the first target position Z1 concurrently with driving of the XY stage. When an imaging ready state SOC is set, an alignment mark image at the target position Z1 is accumulated in the sensor in an accumulation period ctc1. In the accumulation period ctc1, an interferometer PM measures the stage Z position. When the accumulation period ctc1 is over, the Z stage is driven to a next target position Z2 concurrently with the transfer of the image to the frame memory FMEM.

When image transfer to the frame memory FMEM is completed, the sensor S is ready for accumulation. Accordingly, when the Z stage reaches the target position Z2, the sensor S accumulates an image of the mark at the target position Z2 in an accumulation period ctc2. The interferometer PM measures a stage Z position in the accumulation period ctc2 in the same manner as described above. When the accumulation period ctc2 is completed, the Z stage is driven to a next target position Z3 concurrently with the transfer of an image to the frame memory FMEM in a transfer period ftc2. Likewise, the sensor accumulates charge at the target positions Z3 Z4, Z5, and Z6 in accumulation periods ctc3, ctc4, ctc5, and ctc6, and transfers images to the frame memory FMEM in the transfer periods ftc3, ftc4, ftc5, and ftc6. As described above, the interferometer PM measures the position of the Z stage in each of the accumulation periods ctc1 to ctc6. At an imaging completion timing EOC when the sensor accumulation period ctc6 at the target position Z6 is completed, the XY stage is driven toward S3 as a next target position. The images stored in the frame memory FMEM are sequentially transferred to the alignment processor AP in image transfer periods atc1 to atc6. Upon receiving the images, the alignment processor AP sequentially calculates contrast in calculation periods ptc1 to ptc6. Upon calculating contrast at all the Z positions, the alignment processor AP transfers the contrast to the detector DP in a camera transfer period dtc. Upon receiving the contrast calculated in the periods ptc1 to ptc6, the detector DP calculates a best focus position from the calculated contrast and the Z position information of the stage measured in the accumulation periods ctc1 to ctc6. Upon performing such processing at all the measurement shots, the host controller HP performs global alignment measurement by controlling the Z position in each measurement shot region based on the best focus position in each measurement shot.

Example 4 of the first embodiment has been described above. Example 4 can shorten the time required for image transfer processing to the alignment processor AP as compared with the configuration of Example 1 by letting the camera CAM' include the alignment processor AP.

Example 5

Figure 10:
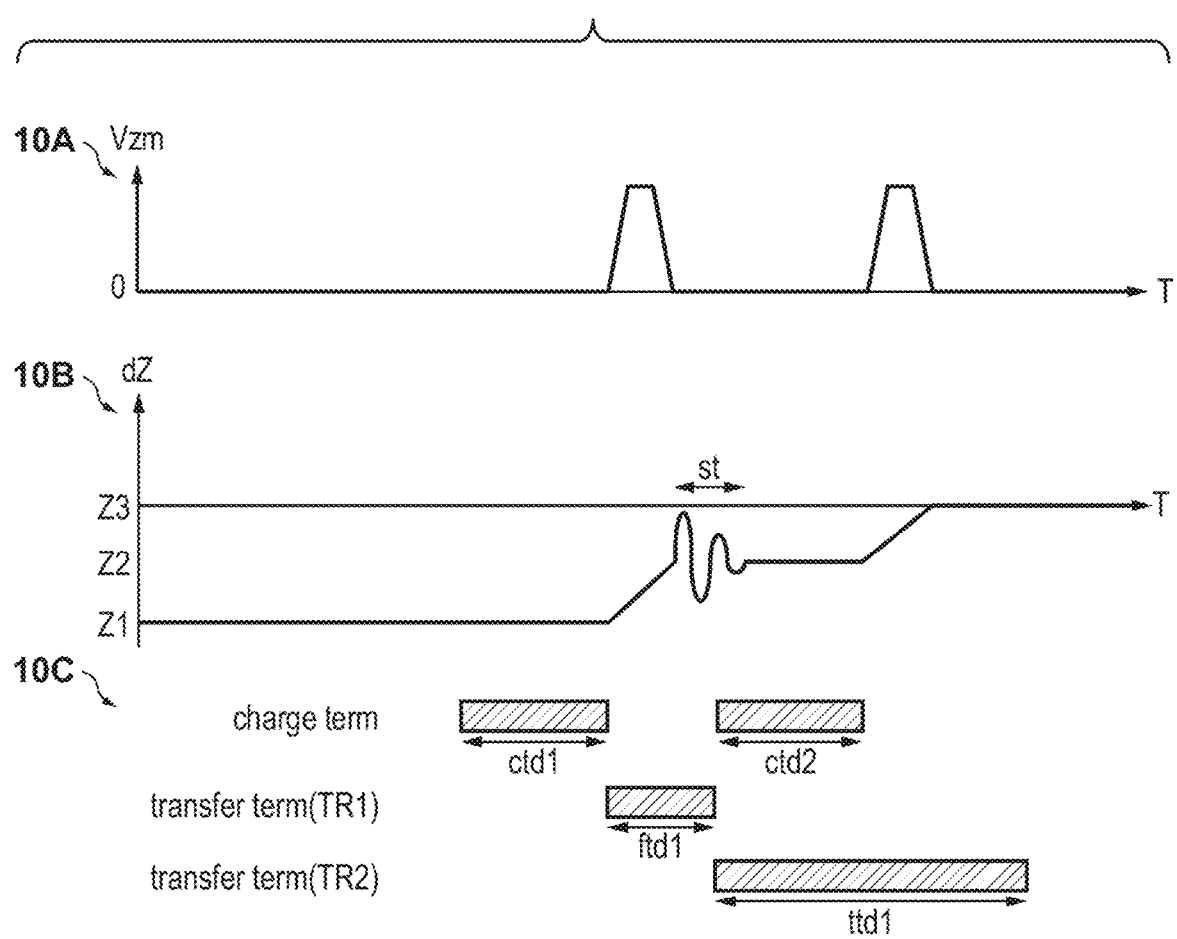
FIG. 10 is a view showing the imaging timings of the stage and the camera in focus measurement according to Example 5 of the first embodiment.

Example 5 of the first embodiment will be described next with reference to FIGS. 10 and 11. Example 1 has described the case in which Z stage driving after the completion of an accumulation period is performed at a driving velocity that is controlled to make a driving period equal to or less than a frame memory transfer period. In this case, if a change (acceleration) in stage driving velocity is steep as indicated by a graph 10A, a deviation may occur after the stage is stopped as indicated by a graph 10B. If a period st during which the deviation occurs overlaps an accumulation period ctd2 indicated by a graph 10C, the imaging target blurs, resulting in a failure to perform accurate measurement.

Accordingly, it is preferable to maximize the time taken for stepped movement within the range in which the total time of the time taken for stepped movement and the accumulation period of charge by a sensor S does not exceed the transfer period of image data from a frame memory FMEM to an alignment processor AP. For example, as indicated by a graph 11A, Z stage driving is controlled to suppress a change (acceleration) in stage driving velocity and inhibit the occurrence of a stage drive deviation. The Z stage driving period in this case is a period zt1 indicated by a graph 11B. Z stage driving is controlled within the range in which the Z stage driving period zt1 becomes shorter than the time required for a camera transfer period ttd1' indicated by a graph 11C. After the completion of Z stage driving, accumulation at the next Z position is performed in an accumulation period ctd2'.

Example 5 of the first embodiment has been described above. In Example 5, Z stage driving is controlled so as not to cause any Z stage driving deviation, and is performed within the range in which the Z stage driving time in this case becomes shorter than the time required for camera transfer period. This makes it possible to perform measurement while ensuring high accuracy.

The first embodiment of the present invention has been described above. This embodiment has exemplified focus measurement and alignment measurement in wafer alignment. However, the embodiment may be executed in reticle alignment and measurement of marks on the stage. In addition, the embodiment has exemplified the alignment marks as measurement targets. However, imaging targets are not limited to alignment mark images and may include, for example, circuit patterns on wafers, dust, defects. The embodiment uses the camera equipped with the frame memory FMEM to perform a series of imaging processing, such as stage control, sensor accumulation, and image transfer to the frame memory, repeatedly at shorter intervals than those of camera transfer processing. This can shorten the imaging processing time.

Second Embodiment

Figure 12A:
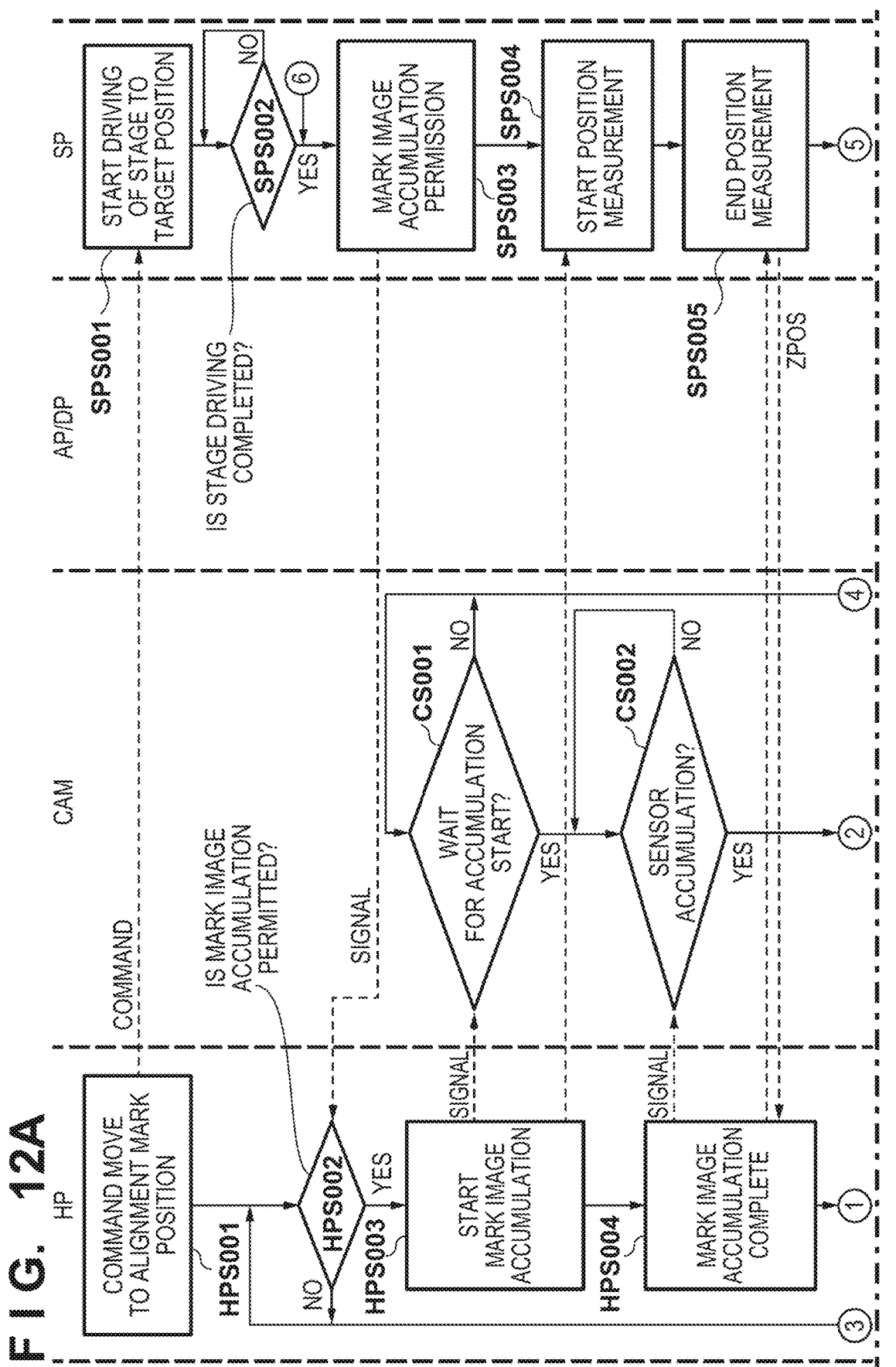
FIGS. 12A to 12C are flowcharts showing an alignment method according to the second embodiment.
Figure 12B:
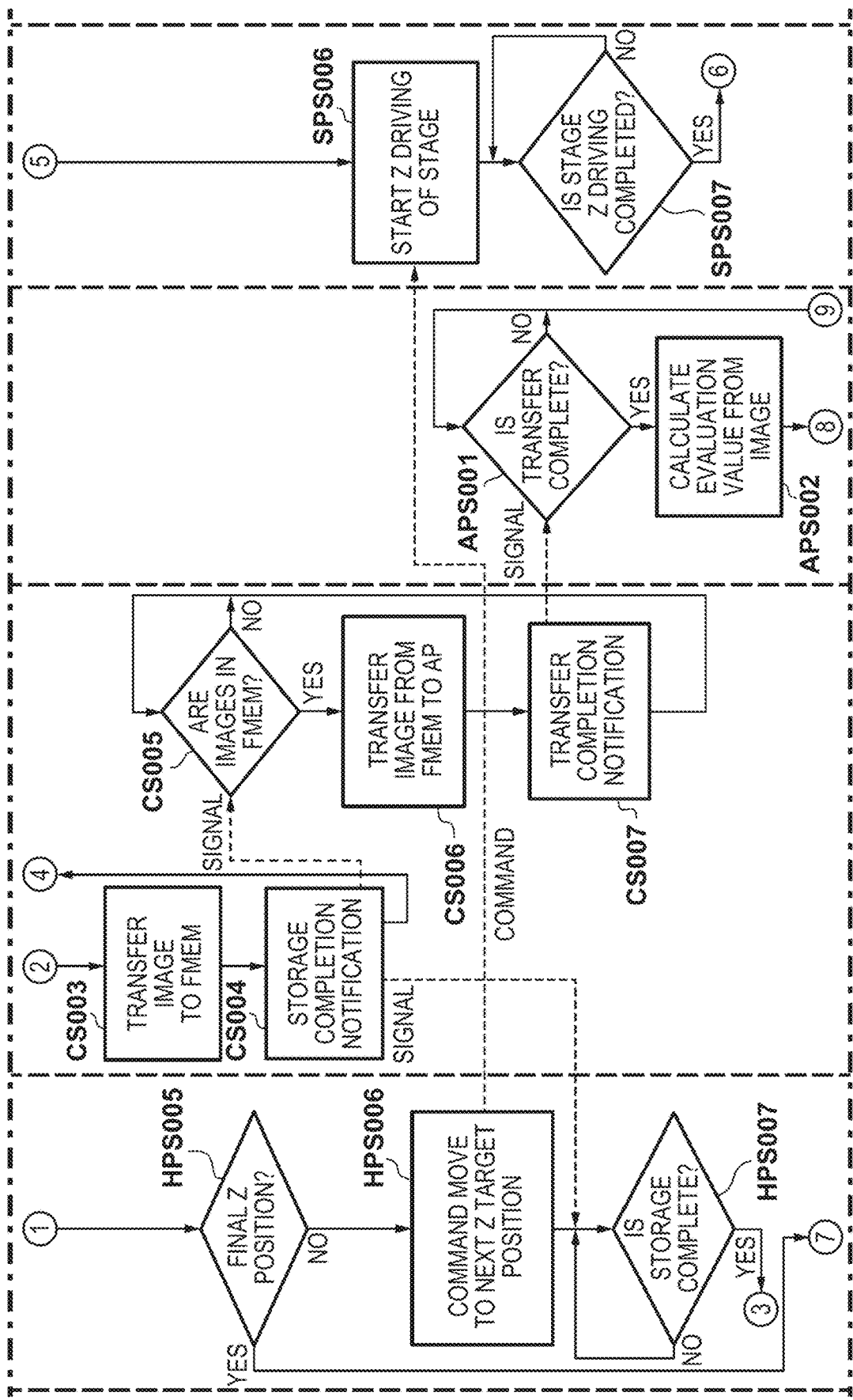
Figure 12C:
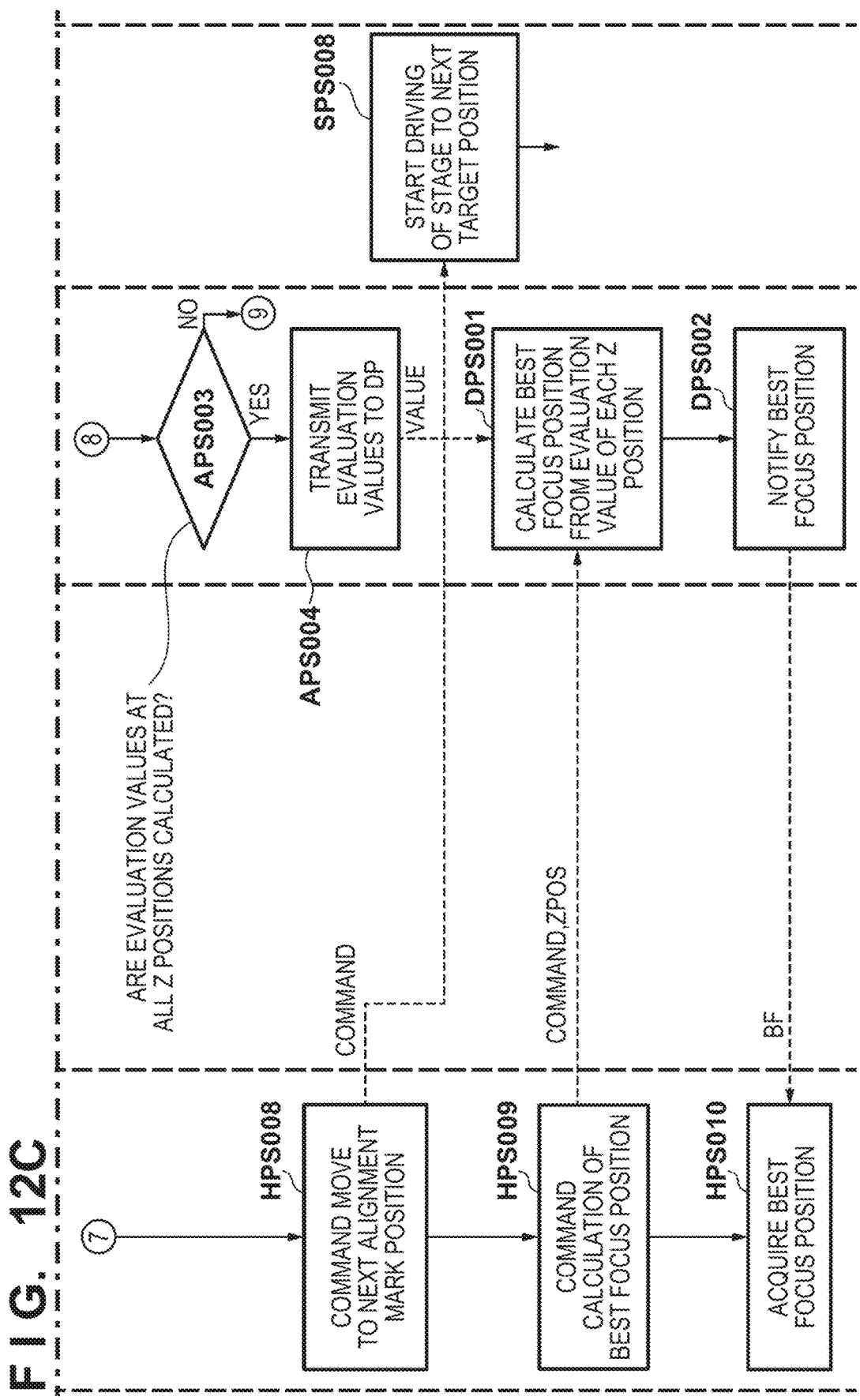

An alignment method according to the second embodiment will be described next with reference to the flowcharts of FIGS. 12A to 12C. The flowcharts shown in FIGS. 12A to 12C are flowcharts for concurrent processing performed by a host controller HP, a camera CAM, an alignment processor AP, a detector DP, and a stage processor SP. This flowchart explains an example of a processing procedure when moving the stage from an alignment mark S1 to an alignment mark S2 on a wafer in FIG. 4 and further moving the stage to an alignment mark S3 after focus measurement.

The host controller HP sends mark coordinates of S2 to the stage processor SP to issue a command to move to the position of S2 (HPS001). The stage processor SP starts stage driving to the mark coordinates of S2 as a target position (SPS001) and waits for the completion of stage driving (SPS002). When the stage driving is completed, the stage processor SP transmits a mark image accumulation permission to the host controller HP (SPS003).

Upon receiving the mark image accumulation permission (HPS002), the host controller HP transmits a mark image accumulation start notification to the camera CAM (HPS003). The host controller HP also transmits the accumulation start notification to the stage processor SP. The stage processor SP starts stage Z position measurement during an accumulation period by using an interferometer (SPS004). Upon receiving the accumulation start notification (CS001), the camera CAM starts sensor accumulation and continues the sensor accumulation until the transmission of a mark image accumulation completion notification (CS002). When the host controller HP transmits the mark image accumulation completion notification (HPS004), the camera CAM completes the sensor accumulation and transfers an image to the frame memory FMEM (CS003). The host controller HP also transmits the accumulation completion notification to the stage processor SP. The stage processor SP finishes the stage Z position measurement during the accumulation period by using the interferometer, and transmits stage Z position information to the host controller HP (SPS005). Upon completion of the transfer to the frame memory FMEM, the camera CAM notifies the host controller HP of a storage completion notification. The host controller HP checks whether accumulation at all the Z positions measured in focus measurement is completed (HPS005) concurrently with CS003 and CS004 performed by the camera CAM. In this case, if accumulation at all the Z positions is not completed, the host controller HP designates the coordinates of a Z target position with respect to the stage processor SP to move to the next Z target position (HPS006). Upon receiving the command from the host controller HP, the stage processor SP starts Z-drive of the stage to the coordinates of the designated Z target position (SPS006). When Z-drive of the stage is completed (SPS007), the stage processor SP transmits a mark image accumulation permission to the host controller HP (SPS003). Meanwhile, the host controller HP waits for a storage completion notification from the camera CAM (HPS007) concurrently with SPS006 and SPS007 performed by the stage processor SP. Upon receiving the storage completion notification, the host controller HP waits for a mark image accumulation completion notification from the stage processor SP (HPS002).

The processing in HPS002 to HPS007, CS001 to CS004, and SPS003 to SPS007 is repeated until image capturing is performed at all the Z positions. The processing of transferring an image to the alignment processor AP is repeated inside the camera CAM by the number of times equal to the number of times of occurrence of a storage completion notification concurrently with the processing in CS001 to CS004 by the camera CAM. If there is an image in the frame memory FMEM (CS005), the image is transferred from the frame memory FMEM to the alignment processor AP (CS006). When image transfer to the alignment processor AP is completed, the camera CAM transmits a transfer completion notification to the alignment processor AP (CS007). Upon receiving the transfer completion notification (APS001), the alignment processor AP calculates contrast as an evaluation value from the transferred image (APS002). When contrast at all the Z positions is calculated (APS003), all the calculated contrast values are transmitted to the detector DP (APS004). The processing in APS001 to APS003 is executed for the image captured at each Z position.

When the processing at the final Z position is completed (HPS005), the host controller HP issues a command to move to the next alignment mark position to the stage processor SP (HPS008). Upon receiving the command, the stage processor SP starts moving the stage to the next target position (SPS008).

The host controller HP issues a command to calculate a best focus position to the detector DP (HPS009). When issuing a command in HPS009, the host controller HP transmits, to the detector DP, the stage Z position information measured by the interferometer, which corresponds to contrast at each Z position. The detector DP calculates a best focus position from contrast at each Z position and the stage Z position information measured by the interferometer (DPS001). After the calculation, the detector DP notifies the host controller HP of the best focus position (DPS002). The host controller HP obtains the best focus position from the detector DP (HPS010). Thereafter, similar processing is performed at subsequent alignment marks.

The second embodiment has been described above. It is possible to shorten the time required for imaging processing by repeatedly executing imaging processing at shorter time intervals than those of camera transfer processing by the method described above.

Third Embodiment

An exposure method by an exposure apparatus 100 in FIG. 1 will be described with reference to FIG. 13. When a sequence by the exposure apparatus starts, a wafer is loaded onto the stage (S001). The exposure apparatus 100 performs alignment processing by executing pre-alignment (S002) and global alignment (S003) in the order named with respect to the wafer loaded onto the stage. In pre-alignment, the exposure apparatus 100 calculates the positions of two alignment marks formed on the wafer with a position detector including a low-magnification scope. Subsequently, the exposure apparatus 100 performs alignment required to perform global alignment by obtaining a coarse wafer shift, a wafer magnification, and wafer rotation. In global alignment, the exposure apparatus 100 observes a plurality of alignment marks formed on the wafer with a position detector including a high-magnification scope. Upon calculating the focus position of the alignment mark at each measurement shot, the exposure apparatus 100 calculates alignment marks in the X and Y directions and accurately obtains each shot position on the wafer by statistical processing of the calculated alignment mark positions. As an alignment apparatus for pre-alignment and global alignment, an alignment apparatus according to the present invention can be used. The exposure apparatus 100 performs exposure processing (S004) based on the shot positions obtained by global alignment. Upon completing exposure on all the shots (S005), the exposure apparatus 100 loads the next wafer (S001). When exposure processing on all the wafers is completed (S006), the exposure apparatus 100 terminates the sequence.

The third embodiment has been described above. According to the third embodiment, performing alignment by using the alignment apparatus according to the present invention makes it possible to perform alignment at higher speed. It is, therefore, possible to expect higher throughput.

Embodiment of Article Manufacturing Method

An article manufacturing method according to an embodiment of the present invention is suitable for manufacturing an article, for example, a microdevice such as a semiconductor device or an element having a microstructure. The article manufacturing method according to this embodiment includes a step of transferring the pattern of an original onto a substrate using the above-described lithography apparatus (an exposure apparatus, an imprint apparatus, a drawing apparatus, or the like), and a step of processing the substrate onto which the pattern has been transferred in the preceding step. This manufacturing method further includes other known steps (oxidation, deposition, vapor deposition, doping, planarization, etching, resist removal, dicing, bonding, packaging, and the like). The article manufacturing method according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-252068, filed Dec. 27, 2017, which is hereby incorporated by reference herein in its entirety.

What is claimed is:
1. An alignment apparatus that performs alignment of a substrate by detecting a mark provided on the substrate, the apparatus comprising:
    a stage configured to move while holding the substrate;
    an imaging device configured to capture an image of the mark on the substrate held by the stage; and
    a processor configured to obtain a position of the mark based on the image of the mark captured by the imaging device,
    wherein the imaging device includes:
        an image sensor configured to accumulate charge by photoelectric conversion;
        a frame memory configured to temporarily store at least one frame of image data obtained based on the charge accumulated by the image sensor;

a first transfer unit configured to transfer one frame of image data obtained by the image sensor to the frame memory; and a second transfer unit configured to transfer one frame of image data read from the frame memory to the processor, wherein a data transfer rate of the first transfer unit is higher than a data transfer rate of the second transfer unit, and the first transfer unit and the second transfer unit operate asynchronously, wherein the imaging device is configured to start next image capturing as long as the accumulation of the charge is performed by the image sensor and transfer of one frame of image data obtained by the accumulation to the frame memory by the first transfer unit is completed even if transfer of the one frame of image data to the processor by the second transfer unit is not completed, and wherein the alignment apparatus moves the stage for next image capturing concurrently with transfer of one frame of image data to the frame memory by the first transfer unit when capturing an image of the mark using the imaging device at a plurality of positions while moving the stage.

2. The apparatus according to claim 1, wherein an image of the mark is captured by the imaging device at a plurality of positions while the stage is moved, and the processor evaluates an alignment state of the stage at each position.

3. The apparatus according to claim 2, wherein the imaging device captures an image of the mark at each step position while performing a stepped movement of moving the stage step by step so as to change stepwise a distance between the image sensor and the stage, and the processor evaluates a focus state of an image of the mark at each step position as the alignment state.

4. The apparatus according to claim 3, wherein the stepped movement is performed within a transfer period of one frame of image data to the frame memory by the first transfer unit.

5. The apparatus according to claim 4, wherein a time taken for the stepped movement is made to coincide with a transfer period of one frame of image data to the frame memory by the first transfer unit.

6. The apparatus according to claim 3, wherein a time taken for the stepped movement is maximized within a range in which a total time of a time taken for the stepped movement and an accumulation period of charge by the image sensor does not exceed a transfer period of one frame of image data from the frame memory to the processor by the second transfer unit.

7. The apparatus according to claim 1, wherein when a plurality of marks provided at different positions on the substrate are to be detected, the imaging device captures an image of a first mark of the plurality of marks, and the stage is started to move for image capturing of a second mark of the plurality of marks by the imaging device during a transfer period of image data of the first mark obtained by the image capturing to the frame memory by the first transfer unit.

8. The apparatus according to claim 1, wherein when a plurality of marks provided at different positions on the substrate are to be detected, the imaging device captures an image of a first mark of the plurality of marks a plurality of times, and the stage is started to move for image capturing of a second mark of the plurality of marks by the imaging device during a transfer period in which image data of a first mark obtained by final image capturing of the plurality of times of image capturing is transferred to the frame memory by the first transfer unit.

9. The apparatus according to claim 1, wherein the first transfer unit comprises a dedicated data bus mounted on a same circuit board as the imaging device, and the second transfer unit comprises a data bus that complies with a communication standard.

10. The apparatus according to claim 1, further comprising a controller configured to control image capturing by the imaging device, wherein the imaging device includes a notification unit configured to notify the controller that the next image capturing is ready, and the controller controls a start timing of the next image capturing by the imaging device based on the notification from the notification unit.

11. A lithography apparatus comprising an alignment apparatus that performs alignment of a substrate by detecting a mark provided on the substrate, the alignment apparatus comprising:
a stage configured to move while holding the substrate;
an imaging device configured to capture an image of the mark on the substrate held by the stage; and
a processor configured to obtain a position of the mark based on the image of the mark captured by the imaging device, wherein the imaging device includes:
an image sensor configured to accumulate charge by photoelectric conversion;
a frame memory configured to temporarily store at least one frame of image data obtained based on the charge accumulated by the image sensor;
a first transfer unit configured to transfer one frame of image data obtained by the image sensor to the frame memory; and
a second transfer unit configured to transfer one frame of image data read from the frame memory to the processor,
wherein a data transfer rate of the first transfer unit is higher than a data transfer rate of the second transfer unit, and the first transfer unit and the second transfer unit operate asynchronously, wherein the imaging device is configured to start next image capturing as long as the accumulation of the charge is performed by the image sensor and transfer of one frame of image data obtained by the accumulation to the frame memory by the first transfer unit is completed even if transfer of the one frame of image data to the processor by the second transfer unit is not completed, wherein the alignment apparatus is configured to move the stage for next image capturing concurrently with transfer of one frame of image data to the frame memory by the first transfer unit when capturing an image of the mark using the imaging device at a plurality of positions while moving the stage, and wherein a pattern of an original is transferred onto a substrate held by the stage of the alignment apparatus.

12. An article manufacturing method comprising:
forming a pattern on a substrate by using a lithography apparatus; and
processing the substrate on which the pattern has been formed,
wherein an article is manufactured from the processed substrate, wherein the lithography apparatus comprises an alignment apparatus that performs alignment of a substrate by detecting a mark provided on the substrate, the alignment apparatus comprising:
a stage configured to move while holding the substrate;
an imaging device configured to capture an image of the mark on the substrate held by the stage; and
a processor configured to obtain a position of the mark based on the image of the mark captured by the imaging device,
wherein the imaging device includes:
an image sensor configured to accumulate charge by photoelectric conversion;
a frame memory configured to temporarily store at least one frame of image data obtained based on the charge accumulated by the image sensor;
a first transfer unit configured to transfer one frame of image data obtained by the image sensor to the frame memory; and
a second transfer unit configured to transfer one frame of image data read from the frame memory to the processor,
wherein a data transfer rate of the first transfer unit is higher than a data transfer rate of the second transfer unit, and the first transfer unit and the second transfer unit operate asynchronously,
wherein the imaging device is configured to start next image capturing as long as the accumulation of the charge is performed by the image sensor and transfer of one frame of image data obtained by the accumulation to the frame memory by the first transfer unit is completed even if transfer of the one frame of image data to the processor by the second transfer unit is not completed, and
wherein the alignment apparatus is configured to move the stage for next image capturing concurrently with transfer of one frame of image data to the frame memory by the first transfer unit when capturing an image of the mark using the imaging device at a plurality of positions while moving the stage.

13. The apparatus according to claim 1, wherein the frame memory comprises a ring buffer that overwrites an oldest image data with a newest image data when a storage area is full.

* * * * *